United States Patent
Emesh et al.

(10) Patent No.: US 7,625,814 B2
(45) Date of Patent: Dec. 1, 2009

(54) FILLING DEEP FEATURES WITH CONDUCTORS IN SEMICONDUCTOR MANUFACTURING

(75) Inventors: Ismail Emesh, Gilbert, AZ (US); Chantal J. Arena, Mesa, AZ (US); Bulent M. Basol, Manhattan Beach, CA (US)

(73) Assignee: ASM Nutool, Inc., Phoeniz, AZ (US)

( * ) Notice: Subject to any disclaimer, the term of this patent is extended or adjusted under 35 U.S.C. 154(b) by 109 days.

(21) Appl. No.: 11/742,302

(22) Filed: Apr. 30, 2007

(65) Prior Publication Data

US 2007/0293040 A1  Dec. 20, 2007

Related U.S. Application Data

(63) Continuation-in-part of application No. 11/394,064, filed on Mar. 29, 2006, now Pat. No. 7,485,561.

(60) Provisional application No. 60/806,705, filed on Jul. 6, 2006.

(51) Int. Cl.
*H01L 21/338* (2006.01)
*H01L 21/8234* (2006.01)
*H01L 21/8244* (2006.01)
*H01L 21/44* (2006.01)

(52) U.S. Cl. .......... 438/610; 438/184; 438/238; 438/678; 257/E23.166

(58) Field of Classification Search ........ 438/184, 438/210, 253, 393, 610, 678, 680, 686; 257/E23.166
See application file for complete search history.

(56) References Cited

U.S. PATENT DOCUMENTS 4,808,273 A  2/1989  Hua
4,978,639 A  12/1990 Hua
6,013,948 A  1/2000  Akram
6,176,992 B1 1/2001  Talieh (Continued)

FOREIGN PATENT DOCUMENTS

EP  1167585  1/2002

(Continued)

OTHER PUBLICATIONS

Reid et al., "Factors influencing damascene feature fill using copper PVD and electroplating." *Solid State Technology*, Jul. 2000, pp. 86-103.

*Primary Examiner*—Alexander G Ghyka
*Assistant Examiner*—Seahvosh J Nikmanesh
(74) *Attorney, Agent, or Firm*—Knobbe Martens Olson & Bear LLP

(57) ABSTRACT

A method of filling a conductive material in a three dimensional integration feature formed on a surface of a wafer is disclosed. The feature is optionally lined with dielectric and/or adhesion/barrier layers and then filled with a liquid mixture containing conductive precursor, such as a solution with dissolved ruthenium precursor or a dispersion or suspension with conductive particles (e.g., gold, silver, copper), and the substrate is rotated while the mixture is on its surface. Then, the liquid carrier is dried from the feature, leaving a conductive layer in the feature. These two steps are optionally repeated until the feature is filled up with the conductor. Then, the conductor is annealed in the feature, thereby forming a dense conductive plug in the feature.

38 Claims, 4 Drawing Sheets

U.S. PATENT DOCUMENTS

| | | |
|---|---|---|
| 6,268,660 B1 | 7/2001 | Dhong et al. |
| 6,270,389 B1 | 8/2001 | Kobayashi et al. |
| 6,270,647 B1 | 8/2001 | Graham et al. |
| 6,277,740 B1 | 8/2001 | Goldstein |
| 6,319,384 B1 | 11/2001 | Taylor et al. |
| 6,319,831 B1 | 11/2001 | Tsai et al. |
| 6,333,248 B1 | 12/2001 | Kishimoto |
| 6,346,479 B1 | 2/2002 | Woo et al. |
| 6,413,388 B1 | 7/2002 | Uzoh |
| 6,433,402 B1 | 8/2002 | Woo et al. |
| 6,458,696 B1 | 10/2002 | Gross |
| 6,482,656 B1 | 11/2002 | Lopatin |
| 6,492,260 B1 | 12/2002 | Kim et al. |
| 6,534,116 B2 | 3/2003 | Basol |
| 6,548,395 B1 | 4/2003 | Woo et al. |
| 6,566,259 B1 | 5/2003 | Ding et al. |
| 6,599,778 B2 | 7/2003 | Pogge |
| 6,620,725 B1 | 9/2003 | Shue et al. |
| 6,709,970 B1 | 3/2004 | Park et al. |
| 6,750,144 B2 | 6/2004 | Taylor |
| 6,762,076 B2 | 7/2004 | Kim |
| 6,846,725 B2 | 1/2005 | Nagarajan |
| 6,852,627 B2 | 2/2005 | Sinha |
| 6,856,025 B2 | 2/2005 | Pogge |
| 6,887,795 B2 | 5/2005 | Soininen |
| 6,897,148 B2 | 5/2005 | Halahan |
| 6,924,224 B2 | 8/2005 | Egitto |
| 6,943,073 B2 * | 9/2005 | Marsh et al. ................ 438/210 |
| 6,965,045 B2 | 11/2005 | Jung |
| 6,975,016 B2 | 12/2005 | Keller et al. |
| 7,019,402 B2 | 3/2006 | Andry |
| 7,067,407 B2 | 6/2006 | Kostamo |
| 2003/0015435 A1 | 1/2003 | Volodarsky et al. |
| 2003/0038038 A1 | 2/2003 | Basol et al. |
| 2003/0089986 A1 | 5/2003 | Gilkes et al. |
| 2003/0119311 A1 | 6/2003 | Basol et al. |
| 2003/0143837 A1 * | 7/2003 | Gandikota et al. .......... 438/629 |
| 2004/0012090 A1 | 1/2004 | Basol et al. |
| 2005/0014317 A1 | 1/2005 | Pyo |
| 2006/0003566 A1 | 1/2006 | Emesh |
| 2006/0046461 A1 * | 3/2006 | Benson et al. .............. 438/612 |

FOREIGN PATENT DOCUMENTS

| | | |
|---|---|---|
| JP | 11165253 | 6/1999 |
| JP | 2000-208443 | 7/2000 |
| WO | WO 01/32362 | 5/2001 |
| WO | WO 01/78135 | 10/2001 |
| WO | WO 03/009361 | 1/2003 |

* cited by examiner

FILLING DEEP FEATURES WITH CONDUCTORS IN SEMICONDUCTOR MANUFACTURING

CROSS-REFERENCE TO RELATED APPLICATIONS

This application claims the priority benefit under 35 U.S.C. §119(e) of Provisional Application Ser. No. 60/806,705, filed Jul. 6, 2006. The full disclosure of this priority application is incorporated herein by reference. This application is also a continuation-in-part application of U.S. application Ser. No. 11/394,064, filed Mar. 29, 2006, the disclosure of which is incorporated herein by reference.

FIELD

The present invention generally relates to semiconductor integrated circuit technology and, more particularly, to a process for filling deep features for 3-D integration.

BACKGROUND

Integrated circuits (ICs) include many devices and circuit members that are formed on a single semiconductor wafer. The current trends in IC technology are towards faster and more powerful circuits. However, as more complex ICs such as microprocessors having high operating frequency ranges are manufactured, various speed related problems are becoming increasingly challenging. This is especially true when ICs having different functions are used to create electronic systems, for example computing systems including processor and memory ICs, where different ICs are electrically connected by a global interconnect network. However, as the global interconnects become longer and more numerous in the electronic systems, RC delay and power consumption as well as low system performance are becoming limiting factors.

One proposed solution to this problem is three dimensional (3-D) integration or packaging technology, where 3-D integration refers to the vertical stacking of multiple dies or chips including ICs within a package. In 3-D integration technology, multiple dies are electrically connected using vertical connectors or 3-D conductive structures which may have depths as well as widths or diameters as large as about 100 micrometers or greater. 3-D conductive structures filling 3-D vias extend through one or more of the wafers and are aligned when the wafers are stacked to provide electrical communication among the ICs in the stacked wafers. 3-D integration may result in reductions of size and weight of the IC package, reduction in power consumption, and increase in performance and reliability.

In general, to fabricate the 3-D interconnects, initially deep vias or deep features are formed in the wafers, which are subsequently filled with a conductive material, typically a metal such as copper for its low electrical resistivity and electromigration characteristics. Electroplating is one of the preferred methods to fill deep vias. There are several 3-D integration techniques. One particular technique focuses on thinning the wafers after filling the via holes.

FIGS. 1A-1H illustrate an exemplary method of forming an IC device 100 using a 3-D integration technique involving thinning wafers after filling via holes. First, a wafer or die 110 including substrate-level IC elements 111 (e.g., transistors, capacitors, resistors, etc.) is provided as shown in FIG. 1A. The front surface 110a of the wafer 110 is then coated with an insulating layer, such as $SiO_2$ film 112. Then, a deep via 113 is formed or drilled, e.g., by masking and etching or applying laser drilling as shown in FIG. 1B. In the illustrated example, although only one via 113 is shown for the sake of clarity, it will be appreciated that multiple vias can be formed in the wafer 110.

A dielectric, such as a CVD $SiO_2$ oxide layer may be coated on the wafer surface and inside the via 113 for the purpose of insulating the via metal such as copper from the bulk silicon and also to minimize the smear of metal during the back-surface thinning process of the wafer 110. The dielectric coated deep via 113 is then lined with a barrier layer such as a Ta/TaN layer and a copper seed layer, before filling copper into the deep via 113 using an electrochemical deposition process. In FIG. 1C, although only a single layer 114 is shown to be on the wafer surface and inside the via 113 for the sake of clarity, it will be understood that the lining layer 114 can represent all three of the dielectic layer, the barrier layer, and the copper seed layer.

Then, the via 113 is overfilled with copper 115 using a conventional electrodeposition process. As is well known, as a downside, conventional electrodeposition processes form a thick overburden layer 116 on the surface of the wafer 110, over the via 113 that is filled, as shown in FIG. 1D, when the filling of the via 113 is completed. This unwanted copper layer on the surface of the wafer 100, often referred to as overburden 116, is then planarized using, for example, a chemical mechanical polishing (CMP) process as shown in FIG. 1E to produce a copper plug 115a. Subsequently, metallization layers 117 are formed and patterned to interconnect the substrate-level IC elements 111 to the copper plug 115a formed in the via 113, as shown in FIG. 1F.

In order to expose the copper plug 115a embedded in the wafer 110, the back surface 110b of the wafer 110 is thinned down to reveal the conductive structure or plug 115a from the back surface 110b of the silicon wafer 110, as shown in FIG. 1G. Wafers made in this manner are then diced and the individual dies 110, 120, 130 are aligned and stacked one top of one another, as shown in FIG. 1H, to complete the 3-D IC device 100. Alternatively, stacking can be conducted at the wafer level.

In the illustrated method, the 3D via and copper plug are formed after forming the substrate-level IC elements and before forming the metallization layers. In other examples, the 3D via and copper plug can be formed before forming the substrate-level IC elements in the wafer or after forming the metallization layers. The sequence of forming the foregoing layers or structures can vary widely depending on the fabrication schemes.

Currently, there are technical challenges in 3-D integration, involving, for example, wafer handling, deep via hole formation, barrier and seed layer deposition, plating, and the subsequent planarization processes.

Fabricating such relatively large 3-D conductive structures with present day electroplating technology has difficulties, although the same technology is successfully applied to fill shallow interlevel via holes. As mentioned above, with the current electroplating technology, to adequately fill such deep vias, it is often necessary to deposit relatively thick layers of metal over the surface of the wafer. This in turn requires the use of a subsequent planarization processes to remove the excess metal from the wafer surface, which process also levels the wafer surface for the subsequent manufacturing step. Such planarization processes typically include chemical mechanical planarization (CMP) processes. The very thick metal not only reduces the throughput of the electrochemical deposition (ECD) tool, but also reduces the throughput of the CMP tool, thus increasing the cost of the fabrication. Besides, it is difficult to deposit a continuous barrier and seed layers in these deep vias, which creates a reliability problem for the 3-D interconnect.

Therefore, to this end, there is a need for alternative methods to form defect-free 3-D conductive structures to electrically connect substrates to one another in a substrate stack.

SUMMARY

Methods are provided for filling a conductive material into a feature formed on a surface of a substrate, where the feature has a width of at least 5 micrometers and a depth of at least about 10 μm. The method includes applying a liquid mixture comprising a conductive precursor in a liquid carrier into the feature and the surface of the substrate. The substrate is rotated while the liquid mixture is on the substrate surface. The liquid carrier is dried to transform the liquid mixture into a conductive layer filling the feature. The conductive layer is then annealed to form a 3-D conductive structure in the feature.

In one embodiment, the mixture comprises a solution with dissolved precursor. In another embodiment, the mixture comprises a suspension of conductive particles, such as gold nanoparticles. In yet another embodiment the mixture is applied using spin-on technique.

In another embodiment, a method of forming an IC device is provided comprising providing a substrate having a first surface and a second surface. The substrate comprises a via formed into the first surface. A liquid mixture comprising a conductive precursor in a liquid carrier is applied into the via and on the first surface of the substrate. The precursor is decomposed such that the precursor is transformed into a conductive plug filling the via. A portion of the substrate is removed from the second surface so as to expose a portion of the conductive plug.

BRIEF DESCRIPTION OF THE DRAWINGS

FIGS. 3A-5C illustrate deposition sequences into a 3-D integration feature in accordance to various embodiments.

DETAILED DESCRIPTION

Figure 1A:
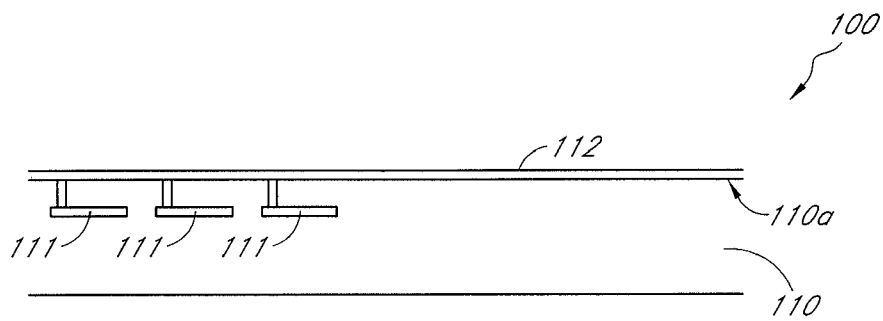
FIGS. 1A-1H are schematic cross sections illustrating an exemplary method of forming an IC device using 3-D integration technology.
Figure 1B:
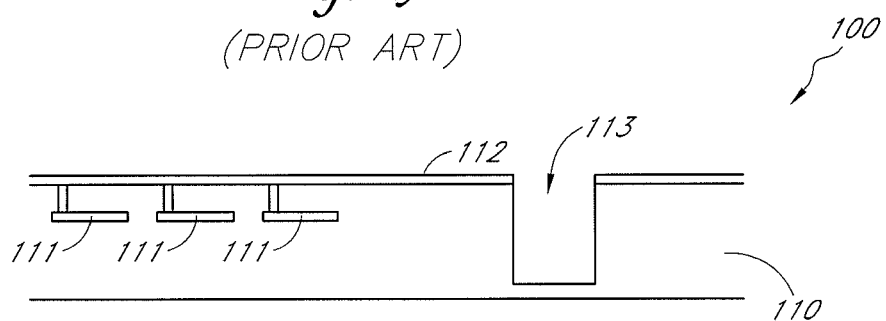
Figure 1C:
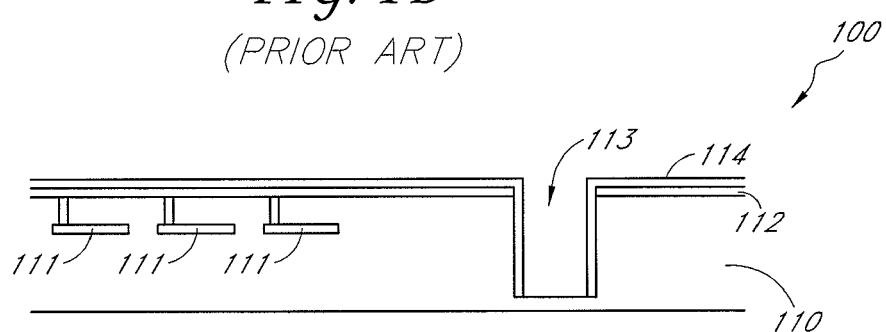

The preferred embodiments provide a method of forming 3-D integration structures such as 3-D interconnects or 3-D conductive structures for 3-D integration of substrates. 3-D integration structures electrically connect a multiplicity of integrated circuits (ICs) in each of substrates that are stacked on top of one another. The 3-D integration structures are also referred to as vertical interconnect structures.

3-D integration structures are fabricated by filling a conductive material into deep features or deep vias, formed in the substrates. A liquid mixture containing the conductive material or, a derivative or a compound of the conductive material (e.g., an oxide of the conductive material) is applied onto a substrate surface. The liquid mixture can be applied, for example, using at least one method of pouring, dipping, injecting on, spinning on, spreading on and spraying. The liquid mixture may contain the conductive material in a chemically dissolved state or dispersed as particles depending on the nature of the conductive material. The substrate, typically a silicon wafer, is rotated beginning either before, during or after the application of the liquid mixture. The liquid mixture may include a dispersion containing nanoparticles of a metallic material or nanoparticles of a compound of the metallic material dispersed in a liquid carrier or solution. The process according to one embodiment fills the conductive material into the deep features and coats the surface of the substrate with a thin layer of the conductive material.

Subsequent heat treatment processes are used to dry and establish desired properties in the conductive material deposited in the features. Steps of drying and application of the liquid mixture may be repeated until the features are completely fill with the conductive material.

After the heat treatment, a back surface of the substrate may be thinned to expose filled conductor or 3-D conductive structure. A CMP or an electrochemical mechanical polishing (ECMP) process may be used to planarize the front surface of the substrate. The planarization process removes the thin conductor layer on the surface of the substrate, which was formed during the application of the solution on the front surface, and isolates the conductor plugs from one another, physically and electrically. Alternatively, the same process may be applied to 3-D via holes continuously extending through more than one wafer of a wafer stack which is formed by aligning and attaching wafers using an appropriate adhesive such a low-k adhesive.

In the following embodiments, a goal is forming 3-D conductive structures in deep features or 3-D vias formed in semiconductor wafers for 3-D integration. In these embodiments, ruthenium oxide ($RuO_2$) or ruthenium (Ru) metal is an exemplary conductor to form the 3-D conductive structures within the deep vias with a very thin overburden on the surface of the wafer. However, the use of $RuO_2$ or Ru is only exemplary and other materials such as Cu, Al, Pt, Au and Ag can be used and are contemplated.

Figure 2A:
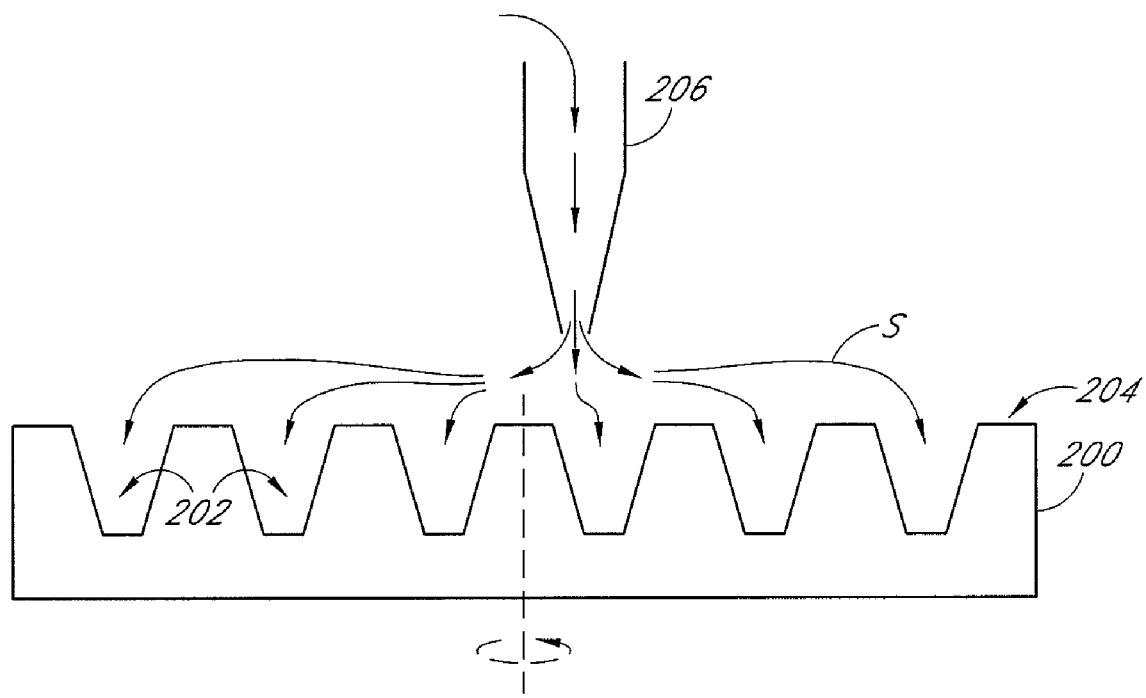
FIGS. 2A and 2B are schematic cross section of a substrate for 3-D integration, where a conductor precursor is delivered in a liquid mixture by spin-on deposition, followed by drying, in accordance with preferred embodiments of the invention.

FIG. 2A illustrates an example of delivering a process liquid mixture or (in the illustrate example) solution S carrying a precursor to a substrate 200 to fill features 202 formed in a first or upper surface 204 of the substrate 200. In this embodiment, the substrate 200 may be an exemplary portion of a semiconductor wafer, for example, a silicon wafer, including a line of vias for 3-D conductive structures. The features 202 or vias are deep vias or so-called 3-D vias to form 3-D conductive structures to run within the substrate 200 (to connect different metal levels) or to run through the thickness of the substrate 200. A 3-D via may be shaped as a circular or rectangular hole (as viewed top down), which extends as a cylindrical or rectangular holes into the wafer. Walls of such holes are perpendicular to the wafer surface. It will be understood that the 3-D vias may have any alternative shape. The walls of the 3-D vias may be straight or tapered at the bottom. In one embodiment, widths or diameters of the 3-D vias 202 are greater than about 5 μm, particularly in a range of about 10 to about 400 μm, and more particularly about 10 to about 100 μm. The depths of the 3-D vias are typically greater than about 10 μm and can be in a range of about 20 μm to about 500 μm. Aspect ratios of the 3-D vias (depth/width ratios) are typically in a range of about 1 to about 10, often greater than about 2, but depends upon the context. For example, 3-D vias can be about 100 μm wide and only about 50 μm deep, thus having an aspect ratio of only about 0.5.

As is well known, the 3-D vias are formed using techniques like etching, laser drilling and the like. Before forming the 3-D vias, a thin layer of $SiO_2$ may be deposited on the wafer surfaces. After the 3-D vias are formed, a $SiO_2$ or silicon nitride layer on the first surface and the inside surfaces of the vias are coated with a dielectric layer, preferably a silicon nitride layer or another layer of $SiO_2$. $SiO_2$ may be deposited using an atomic layer deposition (ALD) process and the thickness of it may be less than about 200 Angstroms. An ALD oxide forms an especially conformal layer inside a deep via. Therefore, in this embodiment and in the following embodiments, the substrate surface and the inside surfaces of the exemplary vias are coated with a conventional dielectric layer, although the dielectric layer will not be shown in the drawings for the sake of clarity. For Ru or $RuO_2$, there is no need for a diffusion barrier layer because they do not tend to diffuse into oxide and silicon. However for adhesion purposes, for example, a Ta or TaN layer may be deposited on the $SiO_2$ or the dielectric layer before establishing any $RuO_2$ or Ru layer in the via. Accordingly in this embodiment 3-D conductive structures may be formed of $RuO_2$ or Ru.

Referring back to FIG. 2A, in this embodiment, the process solution S can be applied onto the substrate 200 and the substrate 200 is spun or rotated. Rotation can initiate before application of the liquid mixture and continue during application; rotation can begin simultaneously with or during the application process; or application can first be conducted and rotation initiated after application of the liquid mixture. Additionally, any of these approaches can be employed multiple times in a cyclical approach. In one example, application can be conducted using a spin-on technique where the process solution S is delivered onto the substrate 200 from a nozzle 206 placed above the first surface 204. Note that while the illustrated embodiment employs a solution with a dissolved conductor precursor, in other arrangements (including the embodiment described below including gold nanoparticles) a liquid mixture containing conductor or conductor precursors may actually be a suspension. The substrate is held and rotated by a carrier (not shown). The nozzle is connected to a supply tank (not shown) and may be moved laterally above the substrate. In this embodiment, the process solution may be a viscous solution containing a ruthenium compound, such as an aqueous solution of a precursor comprising a ruthenium (III) nitrosyl salt or other dissolved ruthenium complexes that contain acyloxy group or alkyl group. The ruthenium (III) nitrosyl salt is a nitrate salt in a dilute nitric acid solution, although other salts of ruthenium in appropriate acids can be alternatively used. An exemplary solution composition may be given as about 10-80% ruthenium (III) nitrosyl salt solution, about 2-50% water-soluble viscosity modifier, about 1-30% volatile organic acid. The water-soluble viscosity modifier is typically glycerol, ethylene glycol or other polyfunctional alcohol. However, solutions of polyvinyl alcohol, polyethylene glycol or other water soluble polymers of wide range of molecular weights can be also used. The volatile organic acid may include, for example, formic acid acetic acid, propionic acid and others, and functional acids like lactic acid. The above solution composition is a chloride-free composition, which is compatible with silicon integrated circuits.

Figure 2B:
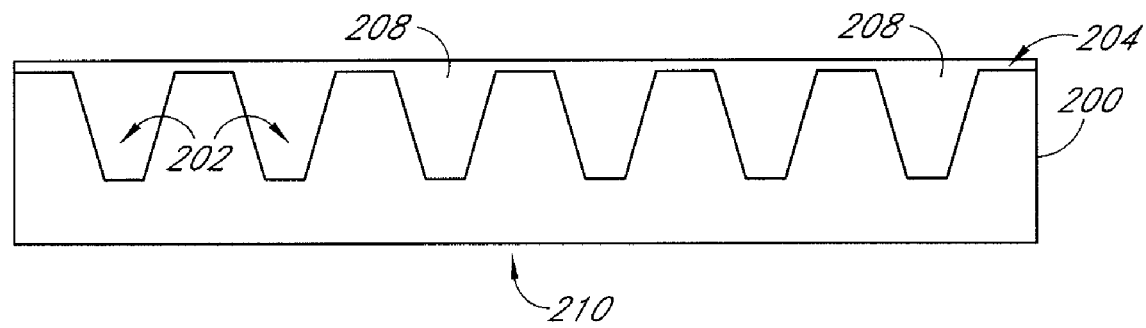

As shown in FIG. 2B, as the solution applied on the substrate 200, a layer 208 fills the 3-D vias 202 and covers the first surface 204 of the substrate. The layer 208 can result in a high viscosity solution or a solid material, depending on the conditions or the spin coating process, i.e., the delivery rate of the solution S, the rotational speed of the carrier, the viscosity of the solution S, the temperature and evaporation rate of the solvent or carrier liquid in the solution S, etc. After forming the layer 208, the layer 208 is dried in a drying step. The substrate is preferably heated above room temperature to hasten the drying process. Typical drying temperatures are between about 50° C. and 150° C., although higher temperatures can be used if the drying process is found to be too slow. On the other hand, continued rotation of the wafer and/or chemical drying agents can reduce the temperature used to dry the material out and to transform the layer 208 into an amorphous ruthenium oxide ($RuO_2$) phase. Transformation in the illustrated embodiment includes precipitation from solution and possibly decomposition, depending upon the precursor and solvent selected. This can be done in air or an inert atmosphere. The solution S can be applied several times and dried in a cyclic fashion (applying the solution, drying it, applying again and so on . . . ) until the 3-D vias are full.

In a subsequent annealing step performed below about 400° C. and particularly below about 300° C. (e.g., between about 200° C. and 300° C.), the layer 208 is transformed into crystalline ruthenium oxide phase (tetragonal phase of ruthenium oxide). The annealing process may be performed using rapid thermal annealing (RTA) in an inert or oxygen ambient for a sufficient time to form crystalline ruthenium oxide. The annealing step can also be done under vacuum.

The process of the foregoing embodiment forms void free ruthenium oxide vertical interconnects at low temperature. Ruthenium oxide fills the 3-D vias and forms a thin layer on the first surface 204. The layer extending on the first surface 204 may be less than about 100 Å in thickness. The thin layer and the underlying dielectric layers can be planarized and removed by a subsequent CMP process. The thinness of the overburden produced by this method reduces cost and time for the next planarization step (CMP or ECMP).

If desired, the ruthenium oxide film, preferably amorphous $RuO_2$ can be reduced to ruthenium metal by performing an annealing in a reducing gas atmosphere, such as in a hydrogen atmosphere or in ethanol vapor at a temperature below about 400° C. As noted above, annealing below about 300° C. is more preferred, particularly in the case of copper interconnects. $RuO_x$, and particularly $RuO_2$, has a relatively high sheet resistivity (e.g., about 100-200 $\mu\Omega\cdot cm$), and thus reduction to Ru is preferred. In case of a hydrogen atmosphere, the annealing can be carried out in a downstream plasma reactor. After the layer 208 is transformed to $RuO_2$ or Ru, a second or lower surface of the substrate 200 may be thinned to expose bottom portions of the layer 208 in the 3-D vias 202. Similarly, CMP or an ECMP process may be used to planarize the first or upper surface to remove the portions of the layer 208 extending on the first surface, thereby physically and electrically isolating the conductors in the 3-D vias 202 and thereby forming the 3-D conductive structures in the vias.

FIGS. 3A-5C show various embodiments of the present invention. In these embodiments, the substrates include only one 3-D feature (via) to show details of the filling process to form a 3-D conductive structure. The nature of the substrate and conventional preparation of the 3-D feature and the following step of coating with a dielectric film is explained above and will not be repeated below.

Figures 3A, 3B, 3C:
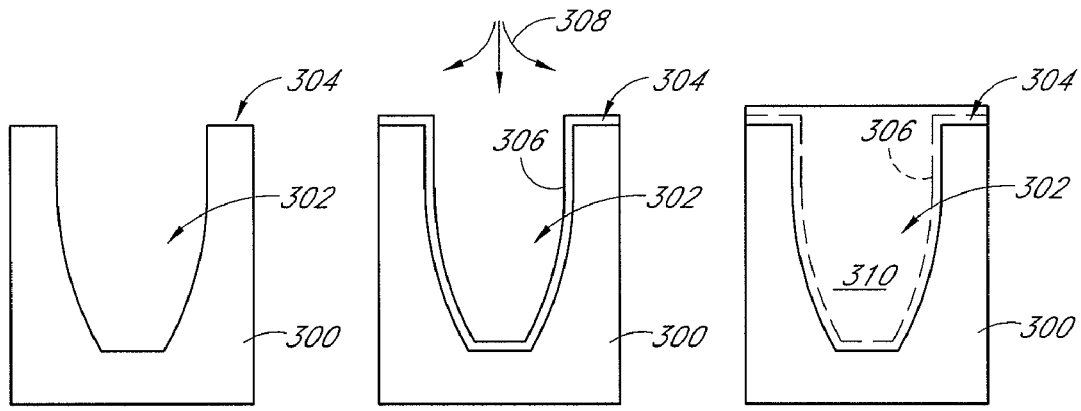

FIGS. 3A-3C illustrate another embodiment of the present invention to form 3-D conductive structures in 3-D vias. As shown in FIG. 3A-3B, in this embodiment a substrate 300 including a 3-D via 302 and a first surface 304 is first coated with a conductive layer 306. The conductive layer 306 may be a layer of ruthenium metal deposited using an atomic layer deposition (ALD) or chemical vapor deposition (CVD) process. A ruthenium conductive layer 306 is preferably less than about 50 Å in thickness. After depositing the conductive layer 306, a solution 308 comprising an aqueous solution of a precursor comprising a ruthenium (III) nitrosyl salt is delivered on the conductive layer 306 using spin-on coating technique. As shown in FIG. 3C, the solution 308 fills the 3-D via 302 and forms a layer 310. Subsequently, the layer 310 is transformed, e.g., by decomposition and precipitation into amorphous $RuO_2$ and crystalline $RuO_2$ by applying the above-described drying and the annealing steps respectively.

Alternatively, the ALD Ru layer may be replaced by a spin-on-coated ruthenium (Ru) layer and the process may be continued with copper electroplating to fill the 3-D via. The Ru layer may be formed from a solution containing the above mentioned ruthenium (III) nitrosyl salt complex. The solution is spun on the wafer surface to form a thin layer of $RuO_2$. This can be obtained by adjusting the viscosity of the solution to ensure that only a thin layer of $RuO_2$ is formed on the via wall. After annealing and reducing the conductive $RuO_2$ to Ru metal, this Ru layer can be used as a seed layer on which copper (Cu) is directly plated (direct plating) using appropriate chemistry and conditions. A conventional plating method, such as ECD (electrochemical deposition) is then applied to form a copper structure in the 3-D via. This step may be followed by annealing and CMP steps.

Figures 4A, 4B, 4C:
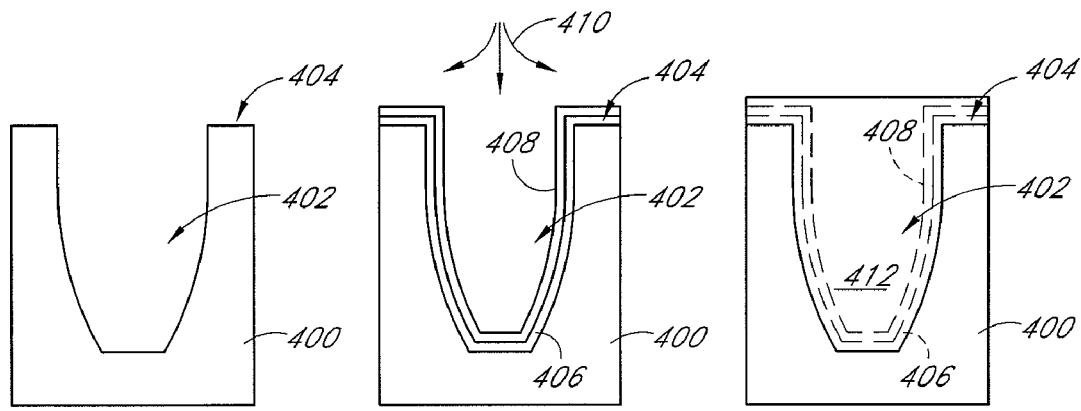

FIGS. 4A-4C illustrate yet another embodiment to form 3-D conductive structures in 3-D vias. As shown in FIGS. 4A-4B, in this embodiment, a substrate 400 including a 3-D via 402 and a first surface 404 is initially coated with a first conductive layer 406 and then a second conductive layer 408 on top of the first conductive layer 406. The first conductive layer 406 may be a layer of ruthenium metal deposited using an atomic layer deposition (ALD) or a chemical vapor deposition (CVD) process. A ruthenium first conductive layer 406 is preferably less than about 50 Å. The second layer 408 may be a copper layer and may have a thickness less than about 500 Å. The second conductive layer 408 may also be deposited using ALD, CVD or direct plating (electrochemical plating). After the second layer 408 deposition, a solution 410 comprising an aqueous solution of a precursor comprising a ruthenium (III) nitrosyl salt is delivered on the second layer 408 using spin-on coating technique. As shown in FIG. 4C, the solution 410 fills the 3-D via 402 and forms a layer 412. Subsequently, the layer 412 is transformed into amorphous $RuO_2$ and crystalline $RuO_2$ by applying the above described drying and the annealing steps respectively. Without wanting to be limited by theory, the transformation may involve precipitation of the Ru precursor upon drying on the liquid carrier (solvent) followed by decomposition into ruthenium oxide, or may involve decomposition of the precursor into ruthenium oxide followed by precipitation upon drying. In this embodiment, the copper layer 408 may partially dissolve and form impurities in the $RuO_2$ layer. This may be used to alter the resistance or the crystallization of the $RuO_2$.

Figures 5A, 5B, 5C:
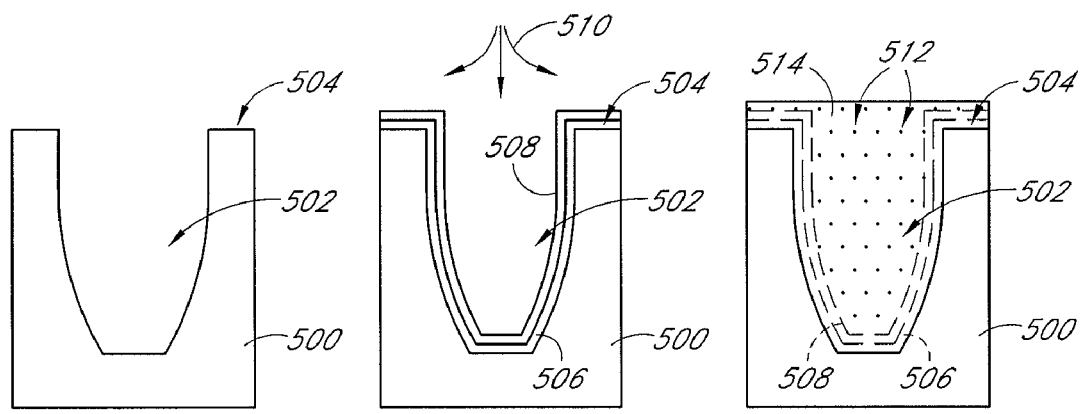

FIGS. 5A-5C illustrate yet another embodiment to form 3-D conductive structures including gold. In this embodiment, a substrate 500 including a 3-D via 502 and a first surface 504 is first coated with a conductive layer 506 and then a second layer 508 on top of the conductive layer 506. The first conductive layer 506 may be a layer of ruthenium metal deposited using an atomic layer deposition (ALD) or a chemical vapor deposition (CVD) process. A ruthenium conductive layer is preferably less than about 50 Å. The second conductive layer 508 may be a copper layer and may have a thickness less than about 500 Å. The second layer 508 may also be deposited using ALD, CVD or direct plating to ensure continuity of the coating in the 3-D via 502. After the second layer 508 deposition, a liquid mixture 510 carrying a precursor, in this example comprising a suspension of a precursor comprising colloidal metal nanoparticles 512 is delivered on the second layer 508 using spin-on coating technique. In this embodiment, nanoparticles 512 may be gold (Au) nanoparticles and may have a particle size in a range of about 1.5 to about 25 nm.

The nanoparticles may alternatively be copper (Cu) or silver (Ag) nanoparticles in a colloidal suspension. A method of forming 3-D conductive structures using a colloidal suspension or ink containing copper nanoparticles is disclosed in U.S. application Ser. No. 11/394,064, filed Mar. 29, 2006, the disclosure of which is incorporated herein by reference. In the method, a suspension or ink containing copper nanoparticles is filled into a via of a substrate. Then, the ink is dried so that the copper particles remain in the via. Subsequently, the copper particles are annealed in the via to form a copper structure or plug in the via.

As shown in FIG. 5C, the liquid mixture 510 fills the 3-D via 502 and forms a layer 514. Subsequently, the layer 514 is transformed into metallic gold by heating and thereby drying the layer 514 at temperature between about 100° C. and about 150° C., particularly about 100° C. The subsequent annealing process is performed at temperature below about 400° C. and particularly at 300° C. either in a reducing atmosphere including, for example, hydrogen gas, or in an inert atmosphere including, for example, nitrogen gas. Drying and applying the liquid carrying the precursor may be repeated. The layer comprising the gold metal includes less than about 100 Å overburden on the surface of the substrate, which can be removed by a subsequent CMP process to isolate the 3-D conductive structure from the neighboring 3-D conductive structures.

An exemplary colloidal suspension of Au nanoparticles may be prepared by mixing $HAuCl_4$ with DI-water. A concentration of the Au ions in the liquid carrier or diluent may be in a range of about 0.01 to about 2% by weight. The liquid carrier also includes a reducing agent and a stabilizer. The reducing agent is added to form the nanoparticles in the liquid suspension. Exemplary chemicals for the reducing agent may be potassium citrate, potassium borohydride (about 0.05 to about 2% in water) or hydroxylamine (about 0.01 to about 1% in water). Exemplary stabilizers include compounds containing sulfonic group of chemicals, such as 2-mercaptoalkyl(C1-5)sulfonic acid, mercaptoethan sulfonic acid or mercapto group such as 2-mercaptoethanol.

Figure 1D:
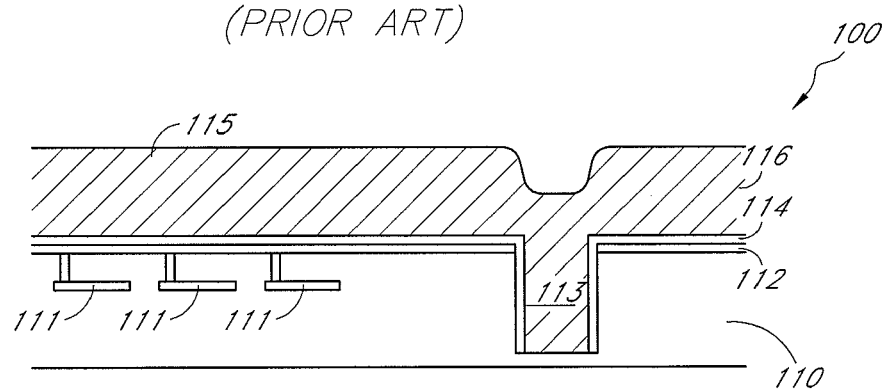
Figure 1E:
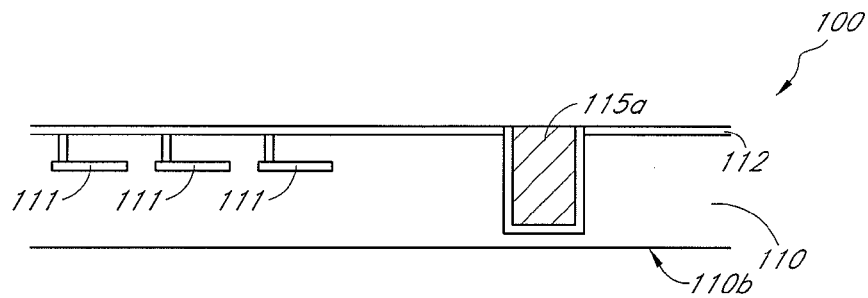
Figure 1F:
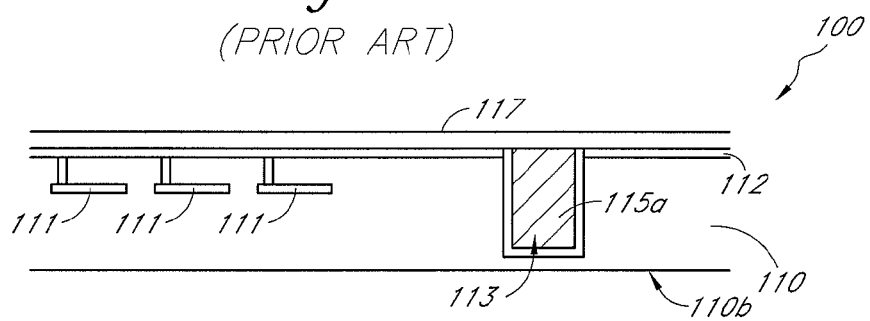
Figure 1G:
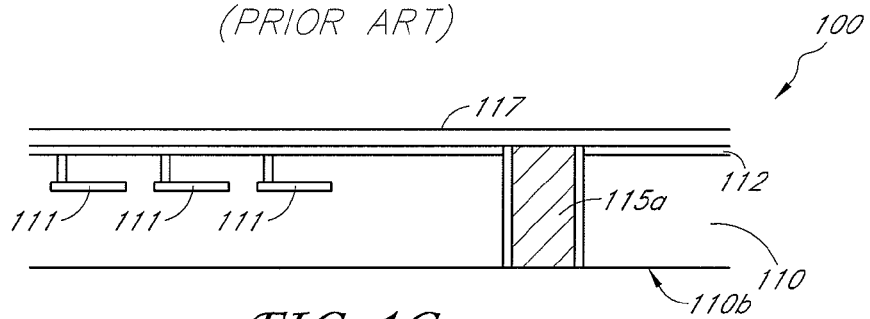
Figure 1H:
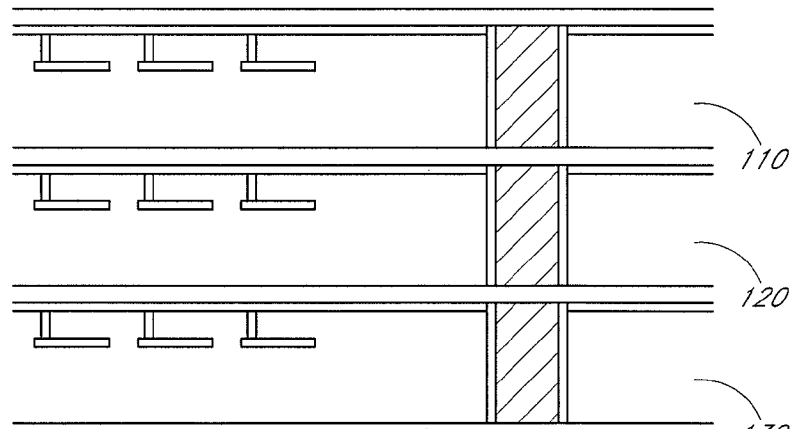

The methods described above with reference to FIGS. 2A-5C are used for forming 3-D integration structures. Any one of these methods can be used in conjunction with the 3-D integration process shown in FIGS. 1A-1H, particularly replacing the step shown in FIG. 1D, and optionally the subsequent step shown in FIG. 1E.

Although various embodiments and the best mode have been described in detail above, those skilled in the art will readily appreciate that many modifications of the exemplary embodiment are possible without materially departing from the novel teachings and advantages of this invention.

We claim:

1. A method of filling a conductive material into a feature formed on a surface of a substrate, the feature having a width of at least about 5 micrometers and a depth of at least about 10 μm, comprising:
   applying a liquid mixture comprising a conductive precursor in a liquid carrier into the feature and on the surface of the substrate;
   rotating the substrate while the liquid mixture is on the surface of the substrate; and
   drying the liquid carrier to transform the liquid mixture into a conductive layer filling the feature, wherein the conductive layer comprises ruthenium oxide.

2. The method of claim 1, wherein rotating is initiated prior to applying and rotation continues during applying.

3. The method of claim 1, wherein rotating is initiated during applying.

4. The method of claim 1, wherein rotating is initiated after applying.

5. The method of claim 1 further comprising annealing the layer to form a vertical conductive structure in the feature.

6. The method of claim 5, wherein drying is conducted between about 50° C. and 150° C. and annealing is conducted between about 250° C. and 400° C.

7. The method of claim 5, wherein drying is conducted below about 100° C. and annealing is conducted below about 400° C.

8. The method of claim 5, wherein annealing is conducted in a hydrogen or ethanol vapor atmosphere.

9. The method of claim 1, further comprising lining the feature with a ruthenium layer prior to applying the liquid mixture.

10. The method of claim 9, wherein the liquid mixture comprises a suspension of conductive nanoparticles.

11. The method of claim 10, where the conductive nanoparticles are formed of a material selected from the group consisting of Cu, Ag and Au.

12. The method of claim 1, further comprising repeating applying and drying.

13. The method of claim 1, wherein the liquid mixture comprises a solution of a dissolved precursor.

14. The method of claim 13, wherein drying comprises precipitation from solution.

15. The method of claim 14, wherein drying further comprises decomposition of the precursor.

16. The method of claim 14, wherein the precursor comprises dissolved ruthenium complex.

17. The method of claim 16, wherein the liquid mixture comprises a water-soluble viscosity modifier.

18. The method of claim 16, wherein the liquid mixture is free of chlorides.

19. The method of claim 1, wherein the liquid mixture comprises a colloidal suspension of conductive particles.

20. The method of claim 19, wherein the conductive particles comprise gold nanoparticles.

21. The method of claim 20, wherein the nanoparticles have a particle size ranging from about 1.5 nm to about 25 nm.

22. The method of claim 19, wherein drying comprises driving off liquid carrier and leaving the conductive particles within the feature and over the surface.

23. The method of claim 19, wherein the suspension includes a reducing agent.

24. The method of claim 19, wherein the suspension comprises a stabilizer.

25. The method of claim 24, wherein the stabilizer contains a sulfonic group or a mercapto group.

26. The method of claim 1, wherein the conductive layer includes less than about 100 Å of overburden on the surface of the substrate.

27. The method of claim 1, further comprising conformally depositing a lining layer within the feature prior to applying the liquid mixture.

28. The method of claim 27, wherein conformally depositing comprises CVD or ALD.

29. The method of claim 27, wherein the lining layer comprises a dielectric.

30. The method of claim 29, wherein the lining layer further comprises an adhesion layer.

31. The method of claim 30, wherein the lining layer further comprises a diffusion barrier.

32. A method of filling a conductive material into a feature formed on a surface of a substrate, the feature having a width of at least about 5 micrometers and a depth of at least about 10 µm, comprising:
applying a liquid mixture comprising a conductive precursor in a liquid carrier into the feature and on the surface of the substrate, wherein the liquid mixture comprises a colloidal suspension of conductive particles, and the suspension includes a reducing agent;
rotating the substrate while the liquid mixture is on the surface of the substrate; and
drying the liquid carrier to transform the liquid mixture into a conductive layer filling the feature,
wherein the reducing agent is selected from the group consisting of potassium citrate, potassium borohydride and hydroxylamine.

33. A method of forming an IC device, the method comprising:
providing a substrate having a first surface and a second surface, the substrate comprising a via formed into the first surface;
applying a liquid mixture comprising a conductive precursor in a liquid carrier into the via and on the first surface of the substrate, wherein the conductive precursor comprises a ruthenium complex;
decomposing the precursor such that the precursor is transformed into a conductive plug filling the via; and
removing a portion of the substrate from the second surface so as to expose a portion of the conductive plug.

34. The method of claim 33, further comprising rotating the substrate before removing the portion of the substrate.

35. The method of claim 33, wherein decomposing the precursor comprises drying the liquid carrier.

36. The method of claim 33, further comprising annealing the conductive plug after decomposing the precursor and before removing the portion of the substrate from the second surface.

37. The method of claim 33, wherein the precursor is dissolved in the liquid carrier.

38. The method of claim 33, further comprising:
providing a second substrate comprising a via and a conductive plug filling the via; and
stacking the second substrate and the substrate over each other.

* * * * *